United States Patent [19]

Chang

[11] 4,042,916
[45] Aug. 16, 1977

[54] MAGNETIC BUBBLE TRACK CROSSOVER ELEMENT

[75] Inventor: Christopher Teh-Min Chang, Dallas, Tex.

[73] Assignee: Texas Instruments Incorporated, Dallas, Tex.

[21] Appl. No.: 613,730

[22] Filed: Sept. 15, 1975

[51] Int. Cl.² ............................................. G11C 11/02
[52] U.S. Cl. ............................................. 340/174 TF
[58] Field of Search .................... 340/174 IC, 174 TF

[56] References Cited

U.S. PATENT DOCUMENTS

| | | | |
|---|---|---|---|
| 3,543,255 | 11/1970 | Morrow | 340/174 IC |
| 3,676,873 | 7/1972 | Lee | 340/174 IC |

Primary Examiner—Thomas B. Habecker
Attorney, Agent, or Firm—Harold Levine; James T. Comfort; William E. Hiller

[57] ABSTRACT

A magnetic bubble domain system in which magnetic bubble domains travel along propagation tracks or paths from one location to another, the complexity of the system being such that individual magnetic bubble domain paths are required to cross each other. A magnetic bubble track crossover element is included in the magnetizable overlay pattern defining the respective magnetic bubble domain propagation paths, being located at the intersection of a pair of such propagation paths so as to regulate the flow of individual bubbles from the respective propagation paths in crossing the intersection to remain undisturbed in continuing their respective courses along the same path. The crossover element is made of the same magnetizable material of the remainder of the magnetizable overlay pattern, e.g. permalloy, as provided on a layer of magnetic material of a type suitable for the propagation of magnetic bubble domains therein. An in-plane rotating magnetic field within the plane of the magnetic layer on which the magnetizable overlay pattern is disposed causes propagation of magnetic bubble domains along different tracks or paths as it revolves. The magnetic bubble domains on different tracks pass through the crossover element intersection at different drive field orientations, free from interference with each other, thereby minimizing the interaction between bubbles from different tracks.

5 Claims, 8 Drawing Figures

MAGNETIC BUBBLE TRACK CROSSOVER ELEMENT

FIELD OF THE INVENTION

This invention relates to magnetic bubble domain logic systems that depend upon the generation and propagation of magnetic bubble domains in the processing of data, wherein the complexity of the magnetic bubble domain system is such as to require individual magnetic bubble domain propagation paths or tracks along which magnetic bubbles are transported from one location to another to cross each other. More particularly, this invention is directed to a magnetic bubble domain track crossover element located at the intersection of crossing bubble propagation tracks or paths, wherein the crossover element is so constructed as to enable bubbles on respective tracks to traverse the intersection while remaining undisturbed in continuing their respective courses along the propagation track corresponding thereto.

DESCRIPTION OF THE PRIOR ART

Magnetic bubble domain technology involves the processing of data by the storage of data bits in the form of magnetic bubbles which are movable in a thin film of magnetic material. These magnetic bubbles are cylindrical magnetic domains whose polarization is opposite to that of the thin magnetic film or layer in which they are disposed. The magnetic film or layer is made of a material which causes the film to have magnetically easy directions essentially perpendicular to the plane of the film. The magnetic properties of this film, e.g. magnetization, anisotropy, coercivity, mobility, are such that the film may be maintained magnetically saturated with magnetization in a direction out of the plane and that small localized regions of polarization aligned opposite to the general polarization direction may be supported. Such localized regions are the magnetic bubble domains of generally cylindrical configuration referred to previously.

These magnetic bubbles can be manipulated by varying the surrounding magnetic fields. For example, the magnetic bubbles may be formed in thin platelets having uniaxial anisotropy with the easy magnetic axis perpendicular to the platelet or film which may comprise such material as rare earth orthoferrites, rare earth aluminum and gallium substituted iron garnets and rare earth cobalt or iron amorphous alloys. Since the magnetic bubbles can be generated, propagated, erased, replicated, and manipulated to form data processing operations and their presence and absence detected, these bubbles may be utilized to perform many of the on-off or primary functions necessary in a binary computer operation.

The relative size of the individual magnetic bubble domains is determined by the strength of the external bias magnetic field perpendicular to the magnetic film. As this external bias magnetic field is increased in strength, the magnetic bubbles are initially caused to form as localized regions at a certain field strength. Continued increase in the strength of the external magnetic field causes the individual bubbles to shrink until they completely disappear.

Typically, the controlled movement of such magnetic bubble domains is accomplished by employing an overlay pattern of magnetizable material (e.g. permalloy) on the surface of the magnetic layer in which the magnetic bubble domains are disposed. This magnetizable overlay pattern is capable of generating magnetic poles in response to magnetic fields in the plane of the magnetic layer and the overlay material. An in-plane rotating magnetic field within the plane of the magnetizable overlay pattern is provided for the purpose of moving magnetic domains along selected bubble propagation paths or tracks. The rotation of the in-plane magnetic field causes it to be re-oriented, thereby causing movement of the magnetic poles generated in the permalloy material of the magnetizable overlay pattern. Consequently, the magnetic bubble domains are also caused to move by virtue of being attracted by the pulls generated in the permalloy material in response to the changing positions of the in-plane magnetic field.

A common form of the magnetizable overlay pattern defining the bubble propagation paths or tracks in a magnetic bubble domain system comprises alternating series of T-shaped or H-shaped permalloy overlay elements and bar-shaped permalloy overlay elements which are respectively spaced apart providing gaps therebetween. This type of arrangement provides a bubble propagation path in which the magnetic bubbles may be propagated in either direction along the path in response to the orientation of the in-plane rotating magnetic field.

Due to the desirability of conserving space in the assembly of a magnetic bubble domain logic system, it would be advantageous to provide some means whereby individual bubble propagation path or tracks may intersect with each other on each chip having a magnetic bubble-supporting film included in the system in order to utilize the available space in the most efficient manner in forming a magnetic bubble domain system of enhanced complexity. In this connection, the magnetic bubble domains are transported from one location to another location along respective bubble propagation paths or tracks in a magnetic bubble domain system. Such a system of increased complexity involving numerous logic operations on a single magnetic bubble domain chip would make it desirable to include intersecting bubble propagation paths to minimize the space requirements. Thus, a magnetic bubble domain crossover means could enable individual bubble domains traveling along respective intersecting bubble propagation paths to traverse the intersection therebetween without interferring with bubbles being propagated along the other bubble propagation path. The desirability of providing some form of bubble crossover unit in a magnetic bubble domain logic system is discussed in the article "Resident-bubble Cellular Logic Using Magnetic Domains"— M.R. Garey, appearing in *IEEE Transactions on Computers*, pages 392–396 (April 1972). The latter article describes a two-dimensional magnetic domain array of rectangular "cells" with each cell containing a certain number of "resident" bubbles, one such cell being termed a crossover cell. Respective bubbles travel along distinct sets of internal paths and may be repelled onto different paths from an input position when a respective bubble from an adjacent cell is located in an interacting position therewith. Upon being forced onto the so-called "hard" path, the respective bubbles may proceed to the output positions on opposite sides of the cell from their respective input positions. While this article by Garey discusses the desirability of a crossover unit in a magnetic bubble domain system to permit separate signal paths to cross, no practical embodiment of a particular operable crossover element enabling synchronized movement of bubbles from different propagation paths across an intersection between the paths and continued movement of such bubbles along their respective paths is disclosed therein.

SUMMARY OF THE INVENTION

In accordance with the present invention, a magnetic bubble domain crossover means has been provided for use in a magnetizable overlay pattern as disposed on one surface of a layer of magnetic material in which magnetic bubble domains can be propagated, so as to enable the fabrication of individual magnetic bubble domain chips capable of preforming logic functions of increasing complexity. In the latter connection, the existence of the magnetic bubble domain crossover means in the magnetizable overlay pattern permits intersecting junctions between magnetic bubble domain propagation paths included in the magnetizable overlay pattern in that individual bubbles being propagated in the respective intersecting paths are able to traverse the intersection between such paths to complete their travel along the same propagation path from which the respective bubbles entered the intersection free from interference with each other in response to the changing orientations of an in-plane magnetic field caused by the rotation thereof. The individual bubbles entering the intersecting junction between a pair of propagation paths are synchronized appropriately such that the bubbles being propagated along different paths pass through the intersection between the paths at different orientations of the in-plane rotating magnetic field, thereby minimizing any interaction between bubbles traveling along different propagation paths.

In a specific embodiment of the invention, the magnetic bubble domain crossover means included in the magnetizable overlay pattern comprises first and second L-shaped members which are arranged in orthogonally offset relationship with respect to each other and include respective leg portions extending at right angles to each other and intersecting intermediate the ends thereof. The other respective leg portions of the first and second L-shaped members are disposed in spaced orthogonal relation with respect to each other, being integral with the one of the first-mentioned leg portions corresponding thereto. The magnetic bubble domain crossover means further includes magnetic bubble domain retention means associated with each of the L-shaped members to retain bubbles traveling along the respective propagation paths in predetermined relative locations of the intersection junction between the propagation paths to prevent the bubbles from being deflected onto the wrong path in traversing the intersection junction. This magnetic bubble domain retention means may take the form of a diagonal bar included in the magnetizable overlay pattern and associated with each of the L-shaped members. Each diagonal bar is so positioned as to intersect the other leg portion intermediate its ends and is connected to the first-mentioned leg portion at a location thereon spaced from the intersecting junction between the first-mentioned leg portions of the first and second L-shaped members. The diagonal bars respectively associated with each of the L-shaped members comprising the magnetic bubble domain crossover means as contemplated herein so affect the repulsion and attraction characteristics of the crossover means as to assure proper movement of the individual bubbles along the same propagation path from which the respective bubbles entered the intersecting junction by preventing deflection of the bubbles onto the wrong propagation path during the movement of the bubbles across the intersection junction.

The magnetic bubble domain crossover means as herein disclosed enables the design of individual magnetic bubble domain chips for performing logic operations to be greatly increased in complexity by permitting respective bubble propagation paths as laid out on the chip to intersect with each other without destroying continuity of bubble movement along such respective paths.

DETAILED DESCRIPTION

Referring more specifically to the drawings, it will be understood that the present invention is concerned with the provision of a magnetic bubble domain crossover means included in a magnetizable overlay pattern on one surface of a magnetic bubble domain-supporting magnetic material in which magnetic bubble domains can be propagated, wherein the magnetic bubble domain crossover means is disposed at the intersection of a pair of magnetic bubble domain propagation paths included in the magnetizable overlay pattern. In this respect, the magnetic bubble domain system may be of the general type described in the article, "Magnetic Bubbles" — Bobeck et al., published in *Scientific American,* pages 78-90 (June 1971). A memory chip as employed in such a magnetic bubble domain system comprises a substrate of monocrystalline non-magnetic material which is overlaid with an epitaxial layer or film of magnetic material of a type in which magnetic bubble domains can be propagated. Preferably, the magnetic material of the layer is a rare earth iron garnet film which may be of the following composition: $(YGdTm)_3(FeGa)_5O_{12}$ or $(YSm)_3(FeGa)_5O_{12}$, for example.

Figure 1:
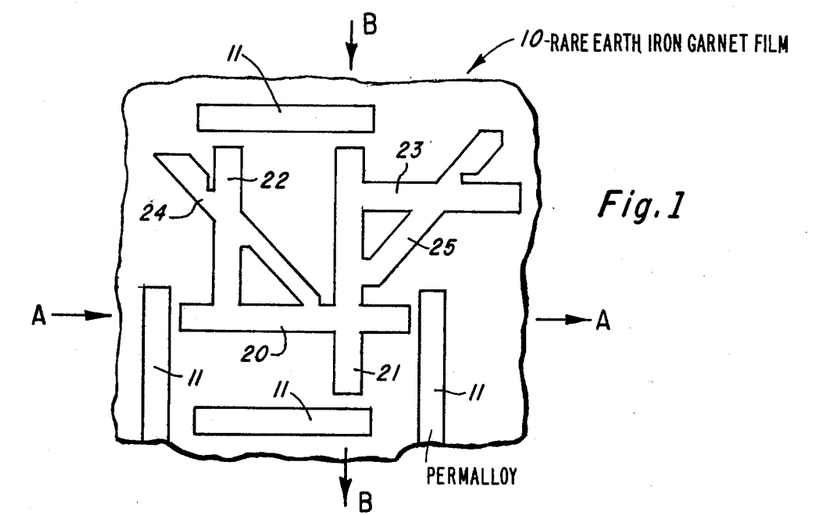
FIG. 1 is a plan view of a fragmentary portion of a magnetizable overlay pattern as disposed on the surface of a layer of magnetic material in which magnetic bubble domains can be propagated, a magnetic bubble domain crossover means being shown at the intersection of a pair of bubble propagation paths A and B.

FIG. 1 illustrates an intersection between a pair of magnetic bubble domain propagation paths or tracks A and B as formed on one surface of a layer 10 of magnetic bubble domain-supporting magnetic material, the intersection being defined by a magnetic bubble domain crossover means as configured in accordance with the present invention. The direction of travel of the respective bubbles being propagated along paths A and B is indicated by the arrows associated with each path. The magnetizable overlay pattern may be of a type containing repetitive segments of magnetizable material alternating with repetitive segments of magnetizable material of a different configuration, wherein adjacent segments are spaced from each other to form gaps therebetween. To this end, FIGS. 2-8 illustrate successive phases in bubble propagation along paths A and B in the direction indicated by the arrows associated therewith, wherein the propagation paths A and B comprise a series of bar elements 11 and a series of either H-shaped elements 12 or T-shaped elements 13 alternating in sequence with the bar elements 11 to define bubble propagation paths in which the individual elements of magnetizable material comprising same are disposed in spaced relation with respect to each other to form gaps therebetween. It will be understood, however, that the precise configuration of the individual magnetizable elements included in the bubble propagation paths A and B may be varied without departing from the spirit of this invention which concerns a magnetic bubble domain crossover means located at the intersection between the propagation paths A and B, to regulate the flow of individual bubbles from the respective propagation paths in crossing the intersection to travel along the respective propagation paths free from interference with each other in response to an in-plane rotating magnetic field.

Referring again to FIG. 1, the magnetic bubble domain crossover means included in the magnetizable overlay pattern at the intersection of the pair of propagation paths A and B comprises first and second L-shaped members arranged in orthogonally offset relationship with respect to each other and having magnetic bubble domain retention means associated therewith. To this end, the first L-shaped member has a leg portion 20 extending at right angles to a respective leg portion 21 of the second L-shaped member, with the respective leg portions 20, 21 intersecting intermediate the ends thereof. The other leg portion 22 of the first L-shaped member is disposed in spaced orthogonal relation with respect to the other leg portion 23 of the second L-shaped member. Thus, the leg portion 22 is integral with the leg portion 20 in defining the first L-shaped member, and the leg portion 23 is integral with the leg portion 21 in defining the second L-shaped member. Each of the first and second L-shaped members has a magnetic bubble domain retention means associated therewith to control movement of magnetic bubble domains along the respective propagation path of the pair of propagation paths of magnetizable material included in the magnetizable overlay pattern applied to the surface of the magnetic bubble-supporting magnetic material 10. The magnetic bubble domain retention means comprises a diagonal bar associated with each of the L-shaped members. To this end, the first L-shaped member is provided with a diagonal bar 24 intersecting the leg portion 22 intermediate its ends and being connected to the leg portion 20 at a location thereon spaced from the intersecting junction between the leg portion 20 of the first L-shaped member and the leg portion 21 of the second L-shaped member. Similarly, the second L-shaped member is provided with a diagonal bar 25 intersecting the leg portion 23 intermediate its ends and being connected to the leg portion 21 at a location thereon spaced from the intersecting junction between the leg portions 20, 21 of the first and second L-shaped members. The leg portions 20 and 21 of the first and second L-shaped members form continuations of the propagation paths A and B, respectively.

It will be understood that an in-plane rotating magnetic field within the plane of the magnetic layer 10 and the magnetizable overlay pattern including the repetitive bar elements 11, the H-shaped members 12, and the T-shaped members 13 induces poles in the respective magnetizable segments depending upon its orientation. By rotating the in-plane magnetic field, the respective magnetic bubbles are caused to move along a selected bubble propagation path. A complete revolution cycle for an in-plane magnetic field is illustrated in FIGS. 2-8 in order to graphically depict the operation of a magnetic bubble domain crossover means in accordance with the present invention. The in-plane magnetic field is diagrammatically shown in FIGS. 2-8 by the arrow designated by reference numeral 30. As shown, the in-plane magnetic field 30 rotates in a counterclockwise direction and serves as a driving force to cause magnetic bubbles included in the magnetizable overlay pattern to travel along the respective propagation paths A and B in response to rotation of the in-plane magnetic field 30 as indicated.

Figure 2:
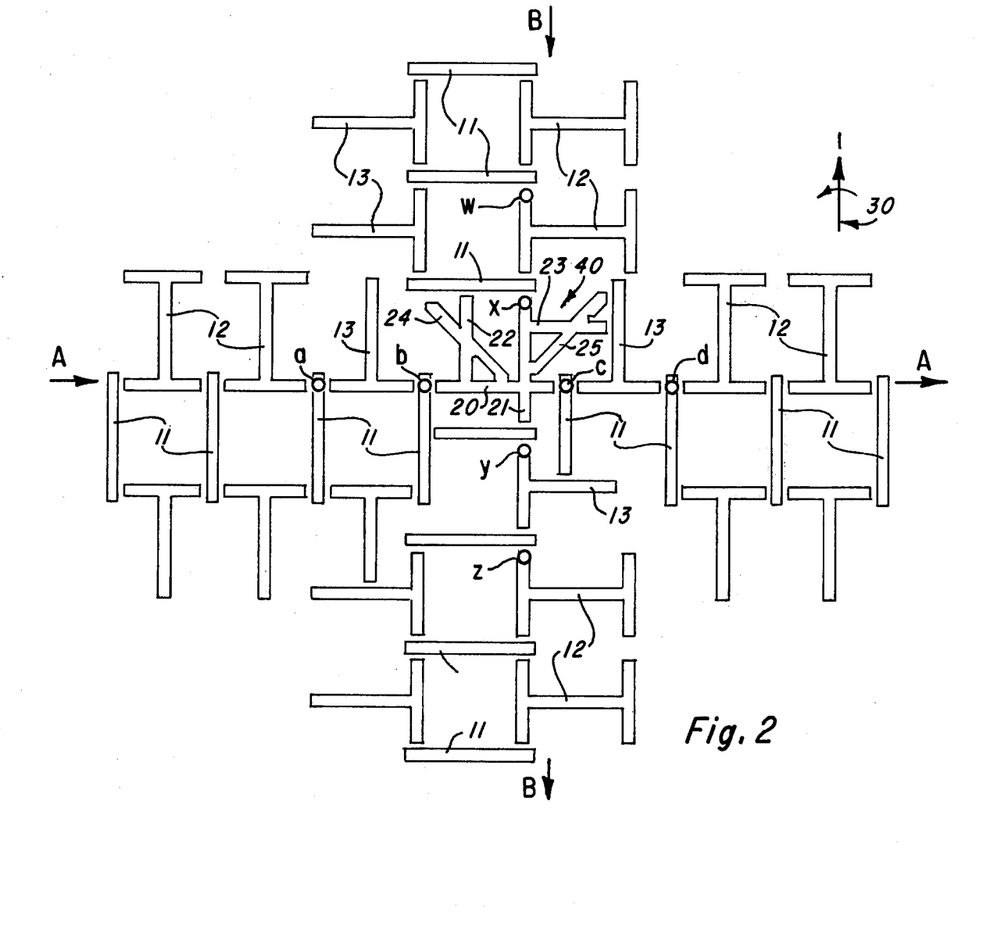
FIGS. 2-8 are respective plan views of a section of a magnetic bubble domain logic system employing a magnetizable overlay pattern on a layer of magnetic bubble domain-supporting material; and showing a magnetic bubble domain crossover means included in the magnetizable overlay pattern at the intersection of a pair of bubble propagation paths A and B, the locations of respective magnetic bubble domains being propagated along the paths A and B being depicted for respective orientations of an in-plane rotating magnetic field through one complete revolution thereof.

For purposes of illustrating the present invention, the magnetizable overlay pattern provided on a surface of the magnetic bubble-supporting magnetic material 10 is configured to comprise a pair of bubble propagation paths A and B intersecting with each other, wherein a magnetic bubble domain crossover means as hereinbefore described is located at the intersection 40 between the propagation paths A and B. By way of example only, four bubbles are depicted in each propagation path A and B, with the location of the respective bubbles being as indicated in FIG. 2 at the starting orientation Phase 1 of the in-plane magnetic field 30, the four bubbles in propagation path A being depicted as bubbles a-d and the four bubbles in propagation path B being depicted as bubbles w-z, respectively. It will be observed that the bubbles a-d in propagation path A are respectively disposed on alternate elements of the path A comprising bar elements 11, whereas the bubbles w-z in propagation path B are respectively disposed on magnetizable elements other than the bar elements 11, such as the H-shaped elements 12 and the T-shaped elements 13, with bubble x being located at the intersection defined by a magnetic bubble domain crossover means 40. The bubbles on the respective propagation paths A and B are therefore synchronized in a spatial relationship with respect to each other such that the bubbles traveling along path A will be caused to pass through the intersection 40 defined by the magnetic bubble domain crossover means at a different drive field orientation for the in-plane magnetic field 30 as compared to the bubbles w-z being propagated along the path B, thereby minimizing interactions between bubbles from the different paths A and B.

Figure 3:
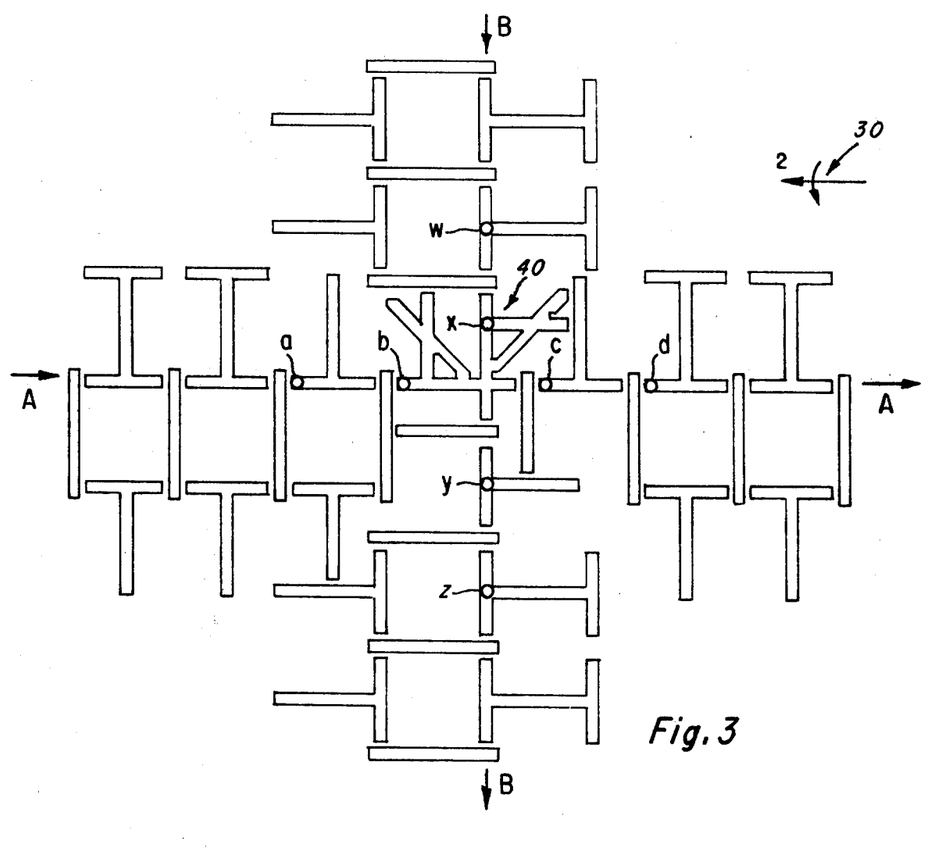

Upon rotating the in-plane magnetic field 30 counterclockwise 90° from the position 1 shown in FIG. 2 to the position 2 as shown in FIG. 3, and assuming that positive poles attract bubble domains, the respective magnetic bubble domains a-d in path A and magnetic bubble domains w-z in path B are caused to move to new positions, the bubbles in path A moving from left to right while the bubbles in path B move in a downward direction orthogonally related to path A. At position 2 of the in-plane magnetic field 30, each of the bubbles a-d in path A is attracted by the respective T-shaped member 13 or H-shaped member 12 and moves across the gap from the adjacent bar element 11 to a new position at the extremity of a T-shaped member 13 or an H-shaped member 12. At this stage, the bubble b advances to a position at the extremity of the leg portion 20 of the first L-shaped member included in the magnetic bubble domain crossover means comprising the intersection 40. The bubbles w-z in path B move downwardly to assume new positions at junctures along the H-shaped members 12 or T-shaped member 13, with the bubble x moving downwardly along the leg portion 21 of the second L-shaped member of the magnetic bubble domain crossover means comprising the intersection 40 to the juncture therewith with the leg portion 23.

Figure 4:
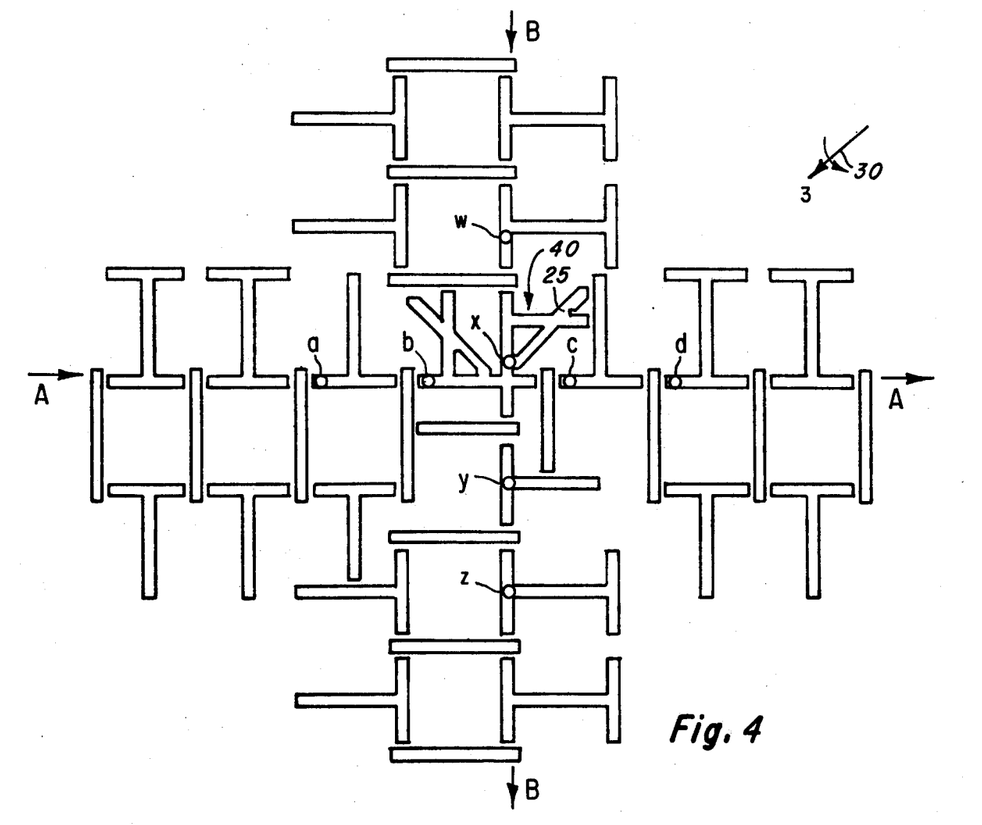

Continued rotation of the in-plane magnetic field 30 to position 3 as shown in FIG. 4 at an orientation displaced substantially 45° from position 2 as illustrated in FIG. 3 effectively causes only bubble x in propagation path B to move to a location at the juncture between the diagonal bar 25 comprising the magnetic bubble domain retention means associated with the second L-shaped member of the crossover means and the leg portion 21. In this connection, it will be observed that the diagonal bar 25 is so arranged as to be substantially parallel to the orientation direction of the in-plane magnetic field 30 in effecting such downward movement of the bubble x from its position as shown in FIG. 3 to that shown in FIG. 4, while all of the remaining bubbles a-d in path A and bubbles w, y, and z in propagation path B remain essentially in the same positions assumed thereby when the in-plane magnetic field 30 was disposed in orientation position 2 as illustrated in FIG. 3.

Figure 5:
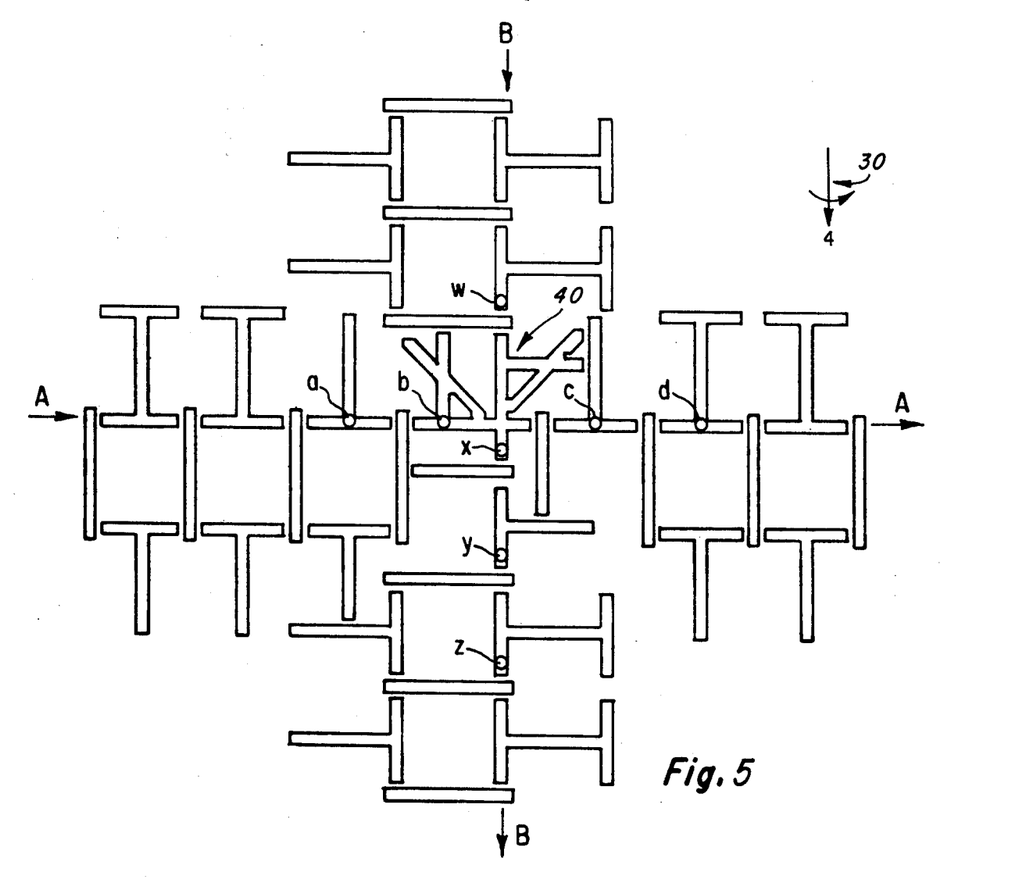

Continued rotation of the in-plane magnetic field 30 to position 4 as illustrated in FIG. 5 causes advancement of all bubbles a-d in path A and bubbles w-z in path B along their respective paths. Thus, bubbles a-d in path A now assume positions at respective junctures of the T-shaped members 13 and H-shaped member 12, with the bubble b moving to a position at the juncture between the leg portions 20, 22 of the first L-shaped member in the crossover element at the intersection 40. In like manner, the bubbles w-z in path B are advanced downwardly along the path B to assume new positions at the lower extremities of the elements of magnetizable material with which they are associated. In this instance, the bubble x traversing the intersection 40 moves to a position at the lower extremity of the leg portion 21 of the second L-shaped member of the crossover means at the intersection 40.

Figure 6:
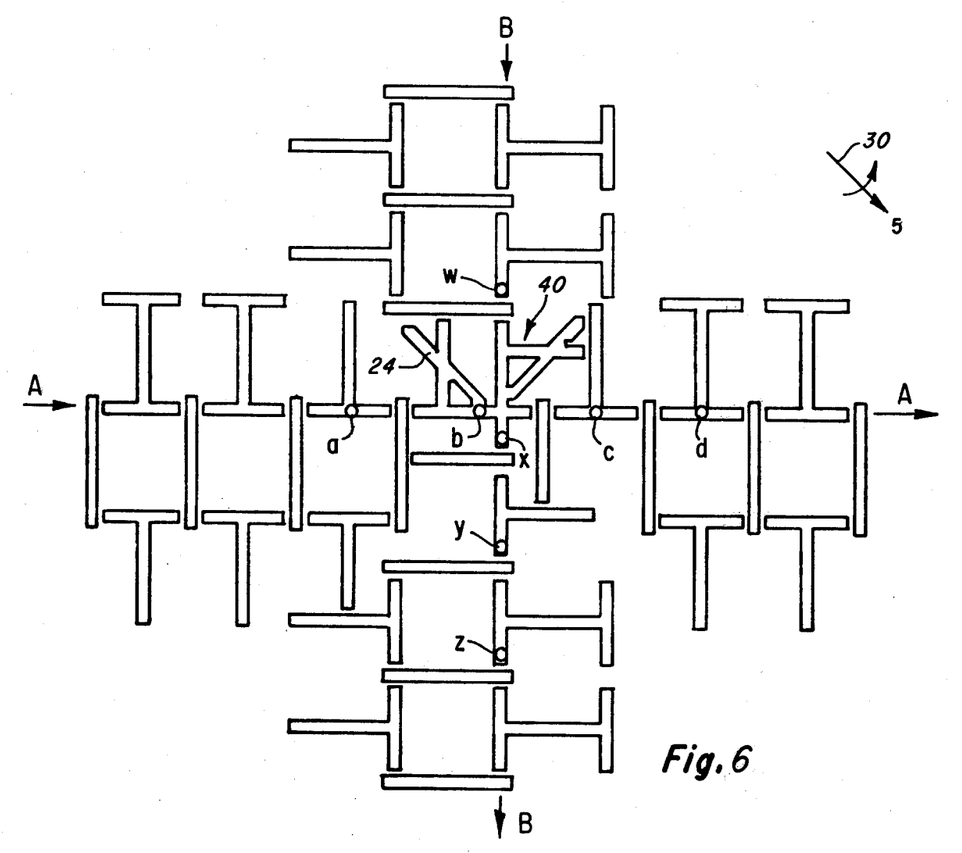

Upon further rotative movement of the in-plane magnetic field to position 5 as depicted in FIG. 6, position 5 being displaced approximately 45° from position 4 shown in FIG. 5, all of the bubbles with the exception of bubble b essentially retain their previous positions along the respective propagation paths A and B. However, bubble b in path A is caused to advance to the juncture between the diagonal bar 24 and the leg portion 20 of the first L-shaped member. In this instance, the diagonal bar 24 is disposed in substantially parallel relationship to the orientation direction assumed by position 5 of the in-plane magnetic field 30. It will be understood that positions 3 and 5 of the in-plane magnetic field 30 as respectively depicted in FIGS. 4 and 6 are complementary in that the respective diagonal bars 24 and 25 associated with the first and second L-shaped members of the crossover element at the intersection 40 prevent bubbles b and x from being deflected onto the wrong path by holding these bubbles at the juncture between the diagonal bar 24 or 25 and the respective leg portion 20 included in path A and leg portion 21 included in path B.

Figure 7:
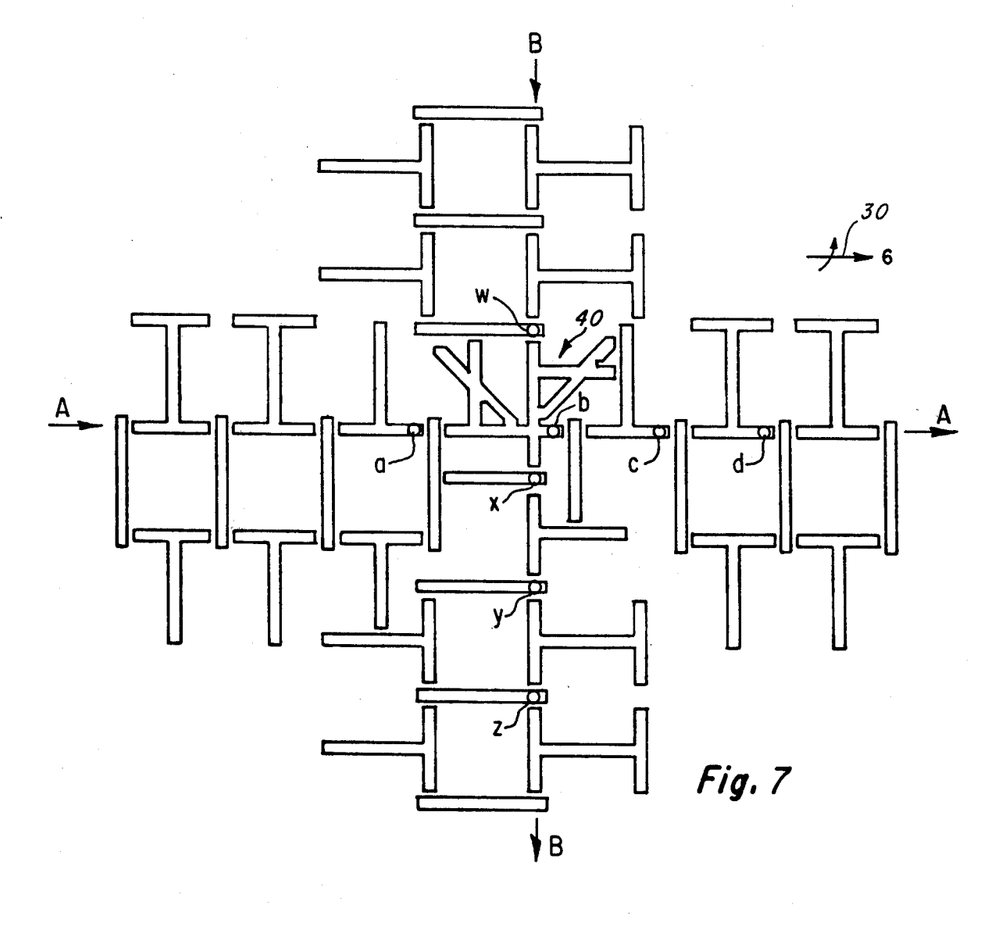

FIG. 7 depicts the movement of the in-plane magnetic field 30 to position 6 which is displaced 90° from position 4 as shown in FIG. 5. The bubbles a-d in path A and bubbles w-z in path B are advanced accordingly to the next location along their respective paths. In this respect, the bubbles in path A now assume positions at the right-hand extremities of the magnetizable overlay element with which they are associated, the bubble b being located at the right-hand extremity of leg portion 20 included in the first L-shaped member of the crossover means at the intersection 40. In like manner, the bubbles w-z in path B are advanced downwardly to assume respective positions at the extremity of a bar element, with bubble x now clearing the intersection 40 by advancing from the leg portion 21 of the second L-shaped member across the gap and onto the opposed extremity of the bar element 11.

Figure 8:
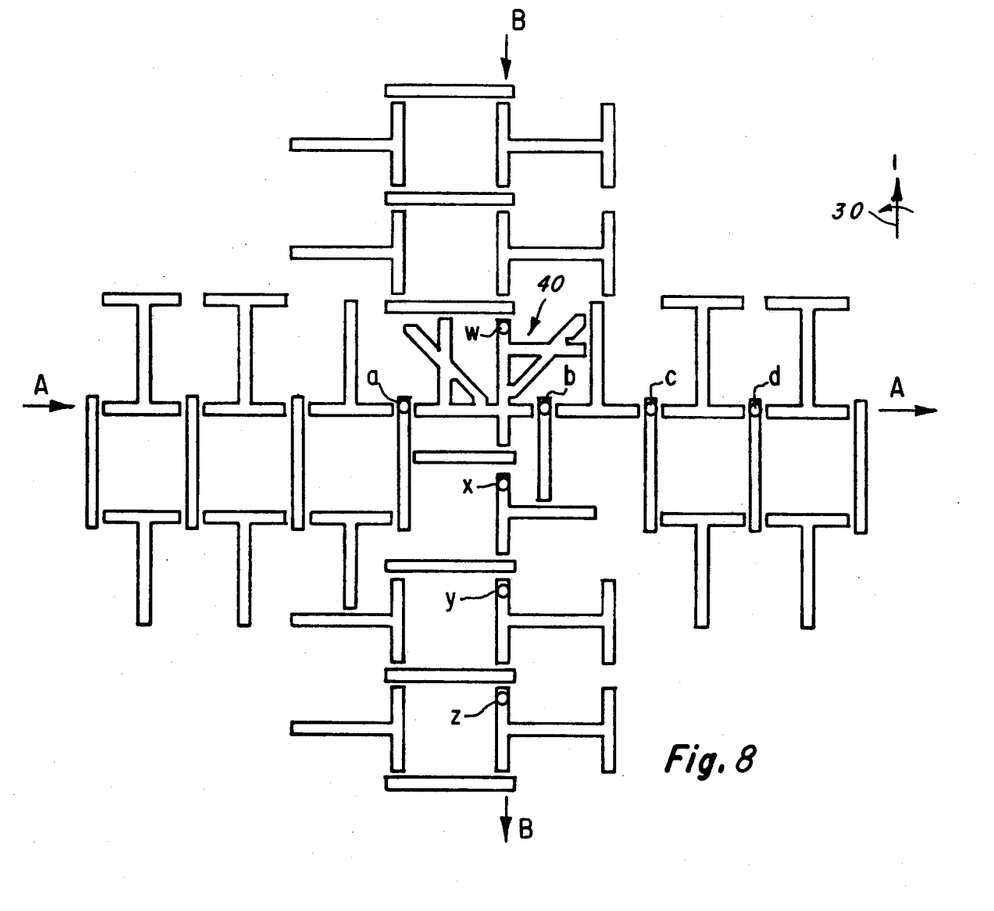

FIG. 8 depicts the completion of one cycle of the in-plane magnetic field 30, wherein the in-plane magnetic field returns to position 1 as first shown in FIG. 2. All bubbles in propagation paths A and B are again advanced from the positions shown in FIG. 7. To this end, it will be observed that the bubbles a-d are now located at extremities of bar elements 11 included in the path A, with the bubble b having now traversed the intersection 40 comprising the crossover means by moving from the leg portion 20 of the first L-shaped member onto the extremity of the bar element 11 arranged in spaced opposed relation thereto. In similar fashion, the bubbles w-z in propagation path B are advanced downwardly from the extremities of the bar elements 11 to the opposed extremities of the T-shaped element 13 and the H-shaped elements 12, with the bubble w now entering the intersection 40 by being located at the upper extremity of the leg portion 21 of the second L-shaped member of the crossover means. Thus, movement of the bubbles along paths A and B has been depicted and described through a complete revolution of the in-plane magnetic field 30, it being understood that continued rotation of the in-plane magnetic field 30 is responsible for propagating the individual bubbles along the paths A and B in the aforesaid described manner.

It will be seen that I have provided a magnetic bubble domain crossover means enabling bubbles traveling along intersecting propagation paths of magnetizable overlay material to continue travel on their respective paths without interference from the bubbles in the other path. Implementation of my invention in a magnetic bubble domain crossover element in a magnetic bubble domain system thereby enables such systems to be designed with greater complexity in that intersecting bubble propagation paths can be provided on a single bubble-supporting chip. Thus, magnetic bubble domain logic chips of such complexity requiring individual magnetic bubble domain propagation paths to cross each other can be incorporated in a magnetic bubble domain system including the usual structures for bubble generation, annihilation, replication, and other bubble functions as employed in data processing.

While a particular embodiment of the invention has been shown, it will be understood that various modifications may become apparent to those skilled in the art without departing from the spirit and scope of the invention which is defined by the appended claims.

I claim:

1. In a magnetic bubble domain system including a layer of magnetic material in which magnetic bubble domains can be propagated, and a magnetizable overlay pattern on one surface of said layer and having a magnetization in the plane of said overlay pattern for defining propagation paths for magnetic bubble domains,
- at least a pair of magnetic bubble domain propagation paths included in said magnetizable overlay pattern,
- said pair of magnetic bubble domain propagation paths intersecting with each other, and
- magnetic bubble domain crossover means included in said magnetizable overlay pattern and disposed at the intersection of said pair of propagation paths for regulating the flow of individual bubbles from the respective propagation paths in crossing the intersection to travel along the respective propagation paths free from interference with each other in response to an in-plane rotating magnetic field, said magnetic bubble domain crossover means comprising
- first and second L-shaped members arranged in orthogonally offset relationship with respect to each other and including respective leg portions extending at right angles to each other and intersecting intermediate the ends thereof,
- said first and second L-shaped members having other leg portions disposed in spaced orthogonal relation with respect to each other and integral with the one of said first-mentioned leg portions corresponding thereto, and
- magnetic bubble domain retention means associated with each of said L-shaped members controlling movement of magnetic bubble domains along the said pair of propagation paths of magnetizable material included in said magnetizable overlay pattern.

2. In a magnetic bubble domain system as set forth in claim 1, wherein said magnetic bubble domain retention means associated with each of said L-shaped members comprises a diagonal bar intersecting said other leg portion intermediate its ends and being connected to said first-mentioned leg portion at a location thereon spaced from the intersecting junction between said first-mentioned leg portions of said first and second L-shaped members.

3. In a magnetic bubble domain system as set forth in claim 2, further including means for providing an in-plane rotating magnetic field within the plane of said magnetic layer and said magnetizable overlay pattern disposed thereon,
- each of said diagonal bars associated with said L-shaped members being substantially parallel to a respective different orientation phase of said in-plane magnetic field and individually influencing movement of a bubble from a corresponding one of said pair of propagation paths to continue along the same path as the bubble traverses said magnetic bubble
- domain crossover means along the corresponding one of said first-mentioned leg portions of said first and second L-shaped members.

4. In a magnetic bubble domain system as set forth in claim 1, further including means for providing an in-plane rotating magnetic field within the plane of said magnetic layer and said magnetizable overlay pattern disposed thereon.

5. In a magnetic bubble domain system as set forth in claim 4, wherein individual bubbles on the first of said pair of propagation paths are disposed to pass through said magnetic bubble domain crossover means at the intersection of said pair of propagation paths at a different orientation sequence of said in-plane magnetic field as compared to the passage of individual bubbles on the other of said pair of propagation paths through said magnetic bubble domain crossover means.

* * * * *